US009608366B2

(12) United States Patent
Vroom et al.

(10) Patent No.: US 9,608,366 B2
(45) Date of Patent: *Mar. 28, 2017

(54) APPARATUS FOR HOLDING AN ELECTRONIC DEVICE

(71) Applicant: Henge Docks LLC, Arlington, VA (US)

(72) Inventors: Matthew Leigh Vroom, San Francisco, CA (US); Benjamin Edwards Maskell, Arlington, VA (US)

(73) Assignee: Henge Docks LLC, Arlington, VA (US)

( * ) Notice: Subject to any disclaimer, the term of this patent is extended or adjusted under 35 U.S.C. 154(b) by 421 days.

This patent is subject to a terminal disclaimer.

(21) Appl. No.: 14/099,998

(22) Filed: Dec. 8, 2013

(65) Prior Publication Data

US 2015/0162703 A1  Jun. 11, 2015

Related U.S. Application Data

(63) Continuation of application No. 14/099,994, filed on Dec. 8, 2013.

(51) Int. Cl.
*H01R 13/62* (2006.01)
*H05K 5/02* (2006.01)
*H05K 7/02* (2006.01)

(52) U.S. Cl.
CPC ....... *H01R 13/6205* (2013.01); *H05K 5/0204* (2013.01); *H05K 5/0221* (2013.01); *H05K 5/0247* (2013.01); *H05K 7/02* (2013.01)

(58) Field of Classification Search
CPC ............ H01R 13/6205; H05K 5/0204; H05K 5/0221; H05K 5/0247; H05K 7/02
USPC ....... 361/729, 742, 758, 753, 757, 807, 808, 361/809; 439/38, 39, 76.1, 217, 218, 700; 455/575.1–575.4, 575.7
See application file for complete search history.

(56) References Cited

U.S. PATENT DOCUMENTS

| | | | | |
|---|---|---|---|---|
| 5,829,987 A | * | 11/1998 | Fritsch | H01R 13/7037 200/51.09 |
| 7,311,526 B2 | * | 12/2007 | Rohrbach | H01R 13/6205 439/218 |
| 8,294,014 B2 | | 10/2012 | Voorhees | |
| 8,376,292 B2 | | 2/2013 | Cicco | |
| 8,419,479 B2 | | 4/2013 | Vroom et al. | |
| 8,456,038 B2 | | 6/2013 | Azancot et al. | |
| 8,490,937 B2 | | 7/2013 | Crain et al. | |
| 8,564,498 B2 | | 10/2013 | Singer | |

* cited by examiner

*Primary Examiner* — Steven T Sawyer
*Assistant Examiner* — Ahmad D Barnes
(74) *Attorney, Agent, or Firm* — Benjamin E. Maskell

(57) ABSTRACT

Disclosed is an apparatus for holding an electronic device that includes an interface surface, a central electrical contact on the interface surface, a first radial electrical contact on the interface surface, a first magnetic member near the first radial electrical contact, and a second magnetic member near the central electrical contact.

20 Claims, 8 Drawing Sheets

APPARATUS FOR HOLDING AN ELECTRONIC DEVICE

This application is a continuation of U.S. application Ser. No. 14/099,994 filed Dec. 8, 2013 the entirety of which is hereby incorporated by reference.

BACKGROUND OF THE INVENTION

Field of the Invention

The embodiments of the invention relate to a mounting system for an electronic device, and more particularly, to a mounting system that provides power to an electronic device. Although embodiments of the invention are suitable for a wide scope of applications, it is particularly suitable for rapidly securing an electronic device into a set position for viewing while simultaneously providing electrical power to the electronic device.

Discussion of the Related Art

A mounting system for an electronic device refers generally to a system or apparatus that holds an electronic device so that it can be secured and easily viewed. Mounting systems are particularly useful in cars where a driver desires to view a mobile phone while driving without touching or holding the device. Mounting systems are also useful in the home or office setting where a user desires to position an electronic device, such as a smart phone or cell phone in a position to be viewed. In the prior art, such as in U.S. Pat. No. 8,376,292 to Cicco or U.S. Pat. No. 8,490,937 to Crain et. al., the holder or "mount" for an electronic device included a plurality of adjustable arms that secured the electronic device using pressure applied to the sides of the device. In other prior art, such as U.S. Pat. No. 8,294,014 to Voorhees, a mount for an electronic device included a flat surface and a plurality of bars on the flat surface which could be positioned to retain the electronic device.

The prior art also includes devices for providing electrical power to a user device. One such method is inductive power such as described in U.S. Pat. No. 8,456,038 to Azancot et. al. Another such method of providing power to an electronic device is described in U.S. Pat. No. 7,311,526 to Rohrback et. al ("MagSafe").

Despite the benefits of the prior art mounting systems, the prior art mounts have limited adjustability to accommodate varying sizes of devices. The retention mechanisms of the prior art, whether bars or adjustable arms, travel in fixed planes and may inadvertently activate side-mounted buttons as are common modern electronic devices. The prior art mounts also require user action to secure the electronic device, such as squeezing or setting the moving arms. The prior art mounting systems do not provide power to the electronic device. A user of the prior art mount would commonly have to manually insert a charging cable into the electronic device. Due to the configuration of the prior art mounting system, a retaining arm or a bar might coincide with the position of the power cable or a headphone cable. The prior art mounting systems also utilized moving parts such as arms and gears that could be broken or become worn.

The prior art technologies for providing power to an electronic device are also limited. Inductive power delivery systems are limited by size and current providing capabilities. Inductive components that transmit sufficient power are often too big to put into compact electronic devices. Inductive power can be inefficient and devices receiving inductive power can become warm. Inductive power can also disrupt the electronic transmissions of the electronic device such a cell phone signal. The MagSafe prior art provides good electrical transmission capabilities, but requires that the connector be precisely inserted into the electronic device.

SUMMARY OF THE INVENTION

Accordingly, embodiments of the invention are directed to a mounting system for an electronic device that substantially obviates one or more of the problems due to limitations and disadvantages of the related art.

An object of embodiments of the invention is to provide a mounting system that provides power to an electronic device.

Another object of embodiments of the invention is to provide a mounting system that can accommodate a wide variety of device sizes and shapes.

Another object of embodiments of the invention is to provide a mounting system that does not interfere with the insertion of peripheral cables.

Another object of embodiments of the invention is to provide a mounting system that does not inadvertently activate buttons on a side of the user device.

Another object of embodiments of the invention is to provide a mounting system that includes an automatic retention mechanism.

Another object of embodiments of the invention is to provide a universal mounting system compatible with a wide range of devices.

Another object of embodiments of the invention is to provide electrical power to the electronic device.

Additional features and advantages of embodiments of the invention will be set forth in the description which follows, and in part will be apparent from the description, or may be learned by practice of embodiments of the invention. The objectives and other advantages of the embodiments of the invention will be realized and attained by the structure particularly pointed out in the written description and claims hereof as well as the appended drawings.

To achieve these and other advantages and in accordance with the purpose of embodiments of the invention, as embodied and broadly described, a housing for an electronic device includes a rear wall having an interior surface and an exterior surface, a central electrical contact in the rear wall, a first cut-out on the exterior surface of the rear wall exposing a portion of the central electrical contact, a first radial electrical contact in the rear wall, and a second cut-out on the exterior surface of the rear wall exposing a portion of the first radial electrical contact.

In another aspect, a housing for an electronic device includes a rear wall having an interior surface and an exterior surface, a central electrical contact in the rear wall, a first cut-out on the exterior surface of the rear wall exposing a portion of the central electrical contact, a first radial electrical contact in the rear wall, a second cut-out on the exterior surface of the rear wall exposing a portion of the first radial electrical contact, a second radial electrical contact in the rear wall, a third cut-out on the exterior surface of the rear wall exposing a portion of the second radial electrical contact, a third radial electrical contact in the rear wall, a fourth radial electrical contact in the rear wall, a fourth cut-out on the exterior surface of the rear wall exposing a portion of the third radial electrical contact, a fifth cut-out on the exterior surface of the rear wall exposing a portion of the fourth radial electrical contact.

In yet another aspect, the a housing for an electronic device includes a rear wall having an interior surface and an exterior surface, a central electrical contact in the rear wall, a first cut-out on the exterior surface of the rear wall exposing a portion of the central electrical contact, a first radial electrical contact in the rear wall, a second cut-out on the exterior surface of the rear wall exposing a portion of the first radial electrical contact, a first magnetic member disposed behind the central electrical contact, and a second magnetic member disposed behind the first radial electrical contact and magnetic attraction created by the first magnetic member substantially maintains the housing in position to interface with an electrical relation.

In another aspect, an apparatus for holding an electronic device includes an interface surface, a central electrical contact on the interface surface, a first radial electrical contact on the interface surface, a first magnetic member near the first radial electrical contact, and a second magnetic member near the central electrical contact.

In still another aspect, an apparatus for holding an electronic device includes an interface surface, a central electrical contact on the interface surface, a first radial electrical contact on the interface surface, a first magnetic member near the first radial electrical contact, a second magnetic member near the central electrical contact, a second radial electrical contact on the interface surface and radially offset 90 degrees from the first radial electrical contact, a third radial electrical contact on the interface surface and radially offset 90 degrees from the second radial electrical contact, and a fourth radial electrical contact on the interface surface and radially offset 90 degrees from the third radial electrical contact.

In yet another aspect, an apparatus for holding an electronic device includes an interface surface, a central electrical contact on the interface surface, a first radial electrical contact on the interface surface, a first magnetic member near the first radial electrical contact, a first magnetic pole of the first magnetic member, the first magnetic pole facing the interface surface, a second magnetic member near the central electrical contact, a second magnetic pole of the second magnetic member, the second magnetic pole facing the interface surface and being an opposite magnetic pole with respect to the first magnetic pole, and magnetic attraction created by the first magnetic member substantially maintains the electronic device in position to interface with the apparatus.

In another aspect, a mounting system for an electronic device includes a first portion associated with an electronic device and a second portion configured to mate with the first portion. The first portion includes a first face formed from an electrically insulating material, a first central electrical contact on the first face, a first plurality of radial electrical contacts on the first face and positioned around the central contact, a first ferromagnetic member. The second portion includes a second face formed from an electrically insulating material, a second central electrical contact on the second face, a first radial electrical contact on the second face, and a first magnetic member. Magnetic attraction between the first magnetic member and the first ferromagnetic member substantially maintains the first and second central electrical contacts in an electrically conductive relationship.

In yet another aspect, a mounting system for an electronic device includes a first portion associated with an electronic device and a second portion configured to mate with the first portion. The first portion includes a first face formed from an electrically insulating material, a first central electrical contact on the first face, a first radial electrical contact on the first face, a second radial electrical contact on the first face, a third radial electrical contact on the first face, a fourth radial electrical contact on the first face, and a first ferromagnetic member. The second portion includes a second face formed from an electrically insulating material, a second central electrical contact on the second face, a fifth radial electrical contact on the second face, a sixth radial electrical contact on the second face, a seventh radial electrical contact on the second face, an eighth radial electrical contact on the second face, and a first magnetic member. Magnetic attraction maintains the first and second central electrical contacts in an electrically conductive relationship.

In yet another aspect, a mounting system for an electronic device includes a first portion associated with an electronic device and a second portion configured to mate with the first portion. The first portion includes a first face formed from an electrically insulating material, a first central electrical contact on the first face, a first radial electrical contact on the first face, a second radial electrical contact on the first face radially offset 90 degrees from the first radial electrical contact about the central electrical contact, a third radial electrical contact on the first face radially offset 90 degrees from the second radial electrical contact about the central electrical contact, a fourth radial electrical contact on the first face radially offset 90 degrees from the third radial electrical contact about the central electrical contact, a first magnetic member, a first magnetic pole of the first magnetic member, the first magnetic pole facing the second surface. The second portion includes a second face formed from an electrically insulating material, a second central electrical contact on the second face, a fifth radial electrical contact on the second face, a sixth radial electrical contact on the second face, a seventh radial electrical contact on the second face, an eighth radial electrical contact on the second face, a second magnetic member, a second magnetic pole of the second magnetic member, the second magnetic pole facing the second surface and the second magnetic pole being an opposite magnetic pole to the first magnetic pole. Magnetic attraction maintains the first and second central electrical contacts in an electrically conductive relationship.

It is to be understood that both the foregoing general description and the following detailed description are exemplary and explanatory and are intended to provide further explanation of embodiments of the invention as claimed.

BRIEF DESCRIPTION OF THE DRAWINGS

The accompanying drawings, which are included to provide a further understanding of embodiments of the invention and are incorporated in and constitute a part of this specification, illustrate embodiments of the invention and together with the description serve to explain the principles of embodiments of the invention.

DETAILED DESCRIPTION OF THE PREFERRED EMBODIMENTS

Figure 1:
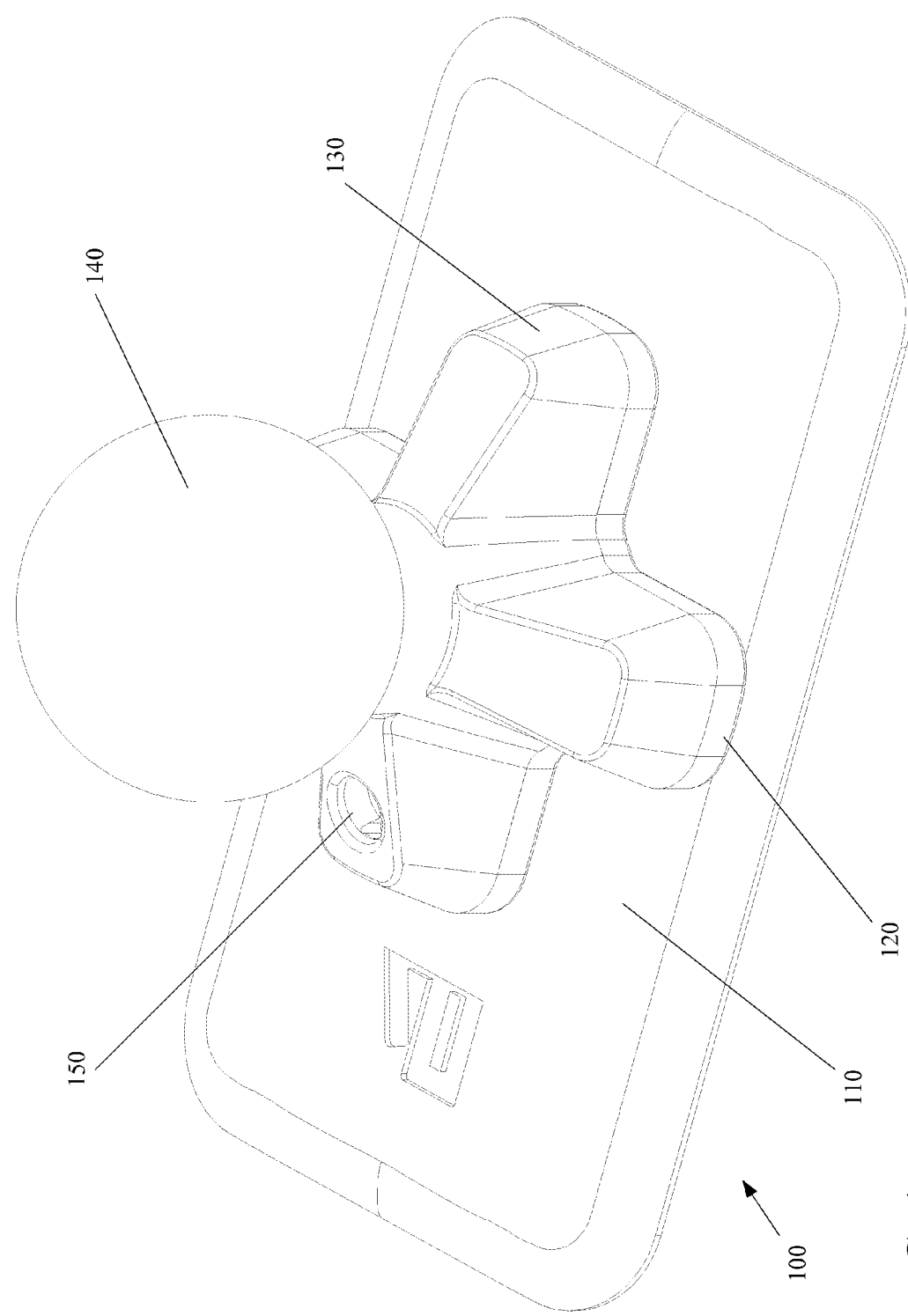
FIG. 1 is an isometric view of a mounting system for an electronic device according to an exemplary embodiment of the invention.

Reference will now be made in detail to the preferred embodiments of the invention, examples of which are illustrated in the accompanying drawings. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thicknesses of layers and regions are exaggerated for clarity. Like reference numerals in the drawings denote like elements.

FIG. 1 is an isometric view of a mounting system for an electronic device according to an exemplary embodiment of the invention. As shown in FIG. 1, the mounting system 100 includes a device-side portion 110, an interface portion 120, and a housing 130. The interface portion 120 and the housing 130 collectively form the base portion (not labeled). The housing 130 can include a ball mount 140 and a power port 150. The power port 150 can be a hole allowing for the passage of a power cable (not shown) or the power port 150 can be a standard electrical connector such as USB or a barrel-style connector. The device-side portion 110 can include magnets (not shown) or ferromagnetic material (not shown). The base portion (not labeled) can also include magnets (not shown) or ferromagnetic material (not shown). A magnetic force can hold the base portion (not labeled) to the device-side portion (110). Electrical connectors (not shown) can pass an electrical signal from the base portion to the device-side portion 110.

Figure 2:
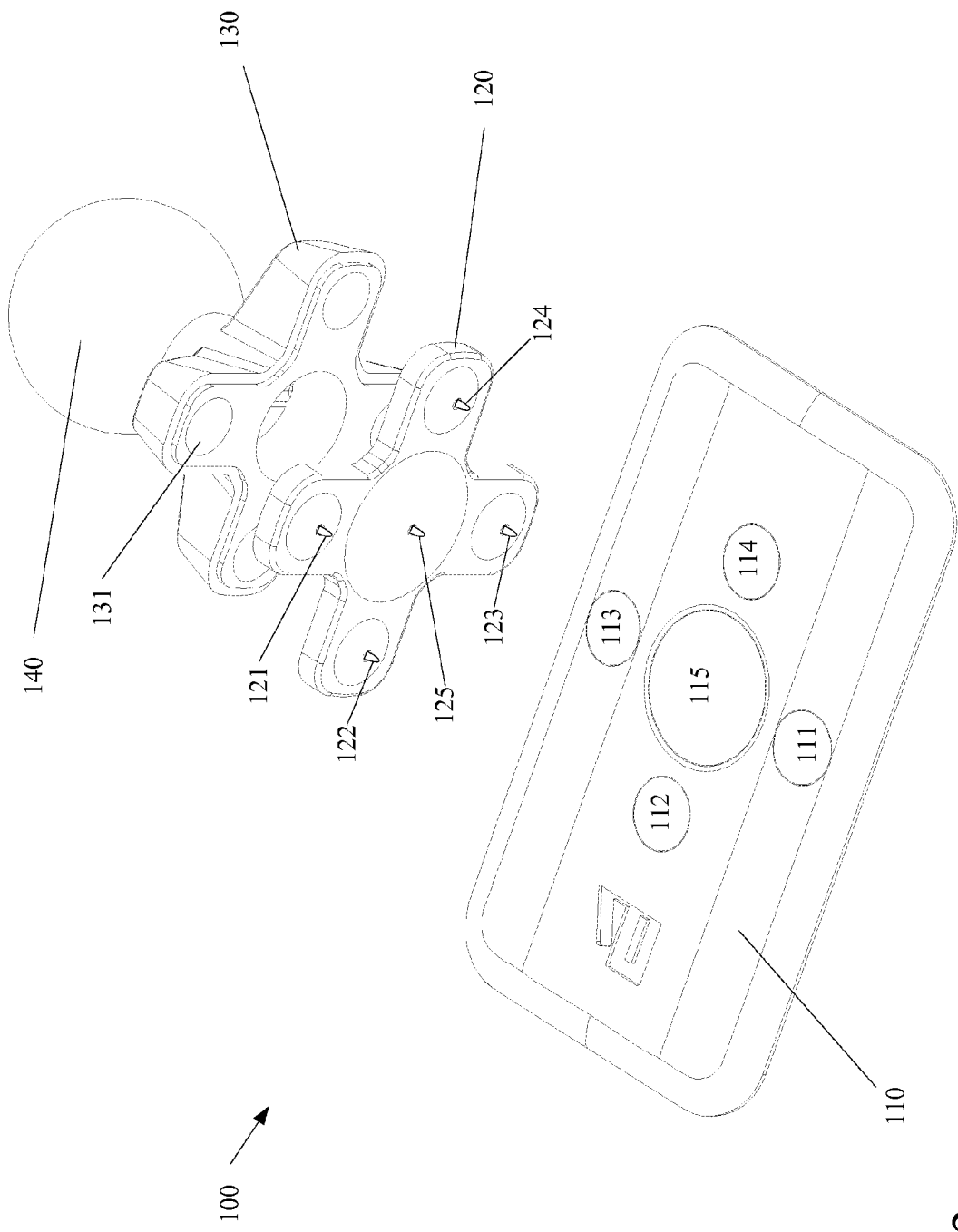
FIG. 2 is an exploded view of a mounting system for an electronic device according to an exemplary embodiment of the invention.

FIG. 2 is an exploded view of a mounting system for an electronic device according to an exemplary embodiment of the invention. As shown in FIG. 2, a mounting system for an electronic device 100 includes a device-side portion 110, an interface portion 120, and a housing 130. The interface portion 120 and the housing portion 130 collectively form the base portion (not labeled). The housing 130 can include a ball-mount 140 which can be retained by devices and methods known to those of skill in the art (see e.g. U.S. Pat. No. 8,564,498 to Singer).

The device-side portion 110 can include electrical contact points 111-115. The electrical contact points 111-115 can receive electrical signals from corresponding electrical contacts 121-125 on the interface portion 120 and provide the signals to the electronic device (not shown). The electrical signals can be, for example, DC power for charging the device or encoded, digital, or analog electrical signal for controlling or interfacing with the electronic device. The electrical contacts 111-115 include a central electrical contact 115 and four radial electrical contacts 111-114 spaced radially outwards from the central electrical contact 115. The electrical contacts 111-115 can be formed from magnets or a ferromagnetic material. The device-side portion 110 can be formed from an insulating material such as plastic, carbon fiber, or resin. The electrical contacts 111-115 can be concave of convex shaped. A concave-shaped electrical contact is generally lower at the middle than the edges relative to the illustrated surface of the device-side portion 110. A convex-shaped electrical contact is generally lower at the edges than the middle with respect to the illustrated surface of the device-side portion 110.

The interface portion 120 includes mating electrical contacts 121-125. The electrical contacts 121-125 can be spring pins, such as those shown and described in U.S. Pat. No. 8,419,479 to Vroom et. al. The housing portion 130 includes voids 131 that can be sized to retain a magnet (not shown) or allow the passage of a wire from the electrical contact 121 through the void 131. The electrical contacts 121-125 of the interface portion 120 can be positioned to correspond to the electrical contacts 111-115 of the device-side portion 110. The device-side portion 110 and the interface portion 120 can be held together by a magnetic attraction between magnets in the base portion and magnets in the device side portion. Those of skill in the art will appreciate that both portions need not contain magnets and that the magnets in either portion can be substituted for ferromagnetic material that is not necessarily permanently magnetized, but merely capably of being attracted to a magnet in the opposing portion. Ferromagnetic materials include iron, nickel, cobalt and most of their alloys, some compounds of rare earth metals, and a few naturally-occurring minerals such as lodestone.

Figure 3:
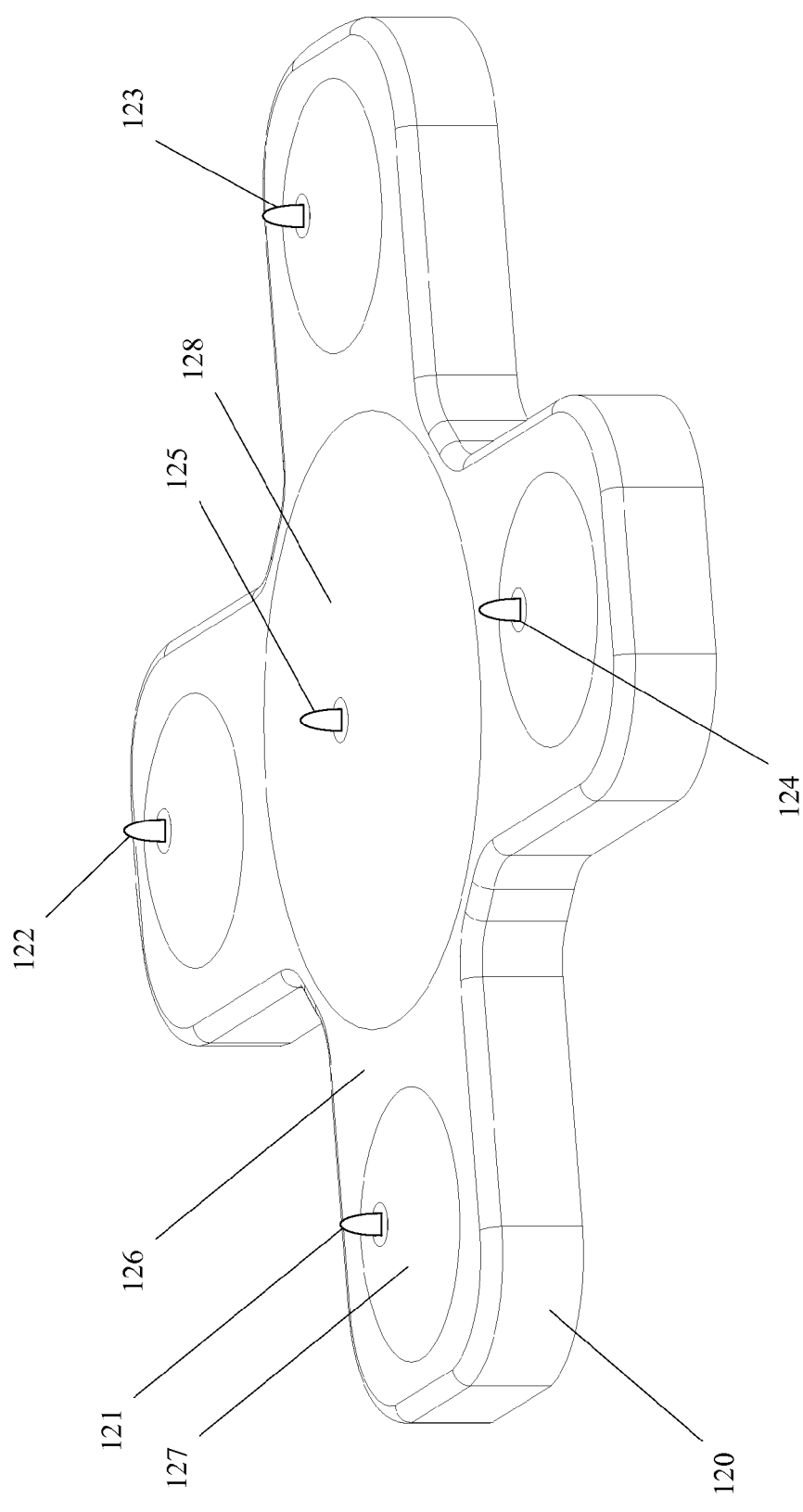
FIG. 3 is an isometric view of an interface portion of a mounting system for an electronic device according to an exemplary embodiment of the invention.

FIG. 3 is an isometric view of an interface portion of a mounting system for an electronic device. As shown in FIG. 3, the interface portion 120 includes electrical contacts 121-125 and an interface surface 126. The electrical contacts 121 and 125 include surrounding portions 127 and 128, respectively. The electrical contacts 122-124 also including surrounding portions (not labeled). The electrical contacts can include a central electrical contact 125. The electrical contacts can further include radial electrical contacts 121-124 that are positioned around the central electrical contact 125. The radial electrical contacts 121-124 can be offset by 90 degrees around the central electrical contact 125. The 90 degree offset positioning allows the device-side portion to be positioned at any of 0 degrees, 90 degrees, 180 degrees, and 270 degrees. This feature is advantageous when a user of the electronic device desires to position an electronic device in either a portrait or landscape orientation.

The surrounding portions 127 and 128 can be convex or concave with respect to the interface surface 126. In embodiments where the surrounding portions 127 and 128 are convex, the electrical contacts of the corresponding device-side portion (not shown) can be concave. The mating of the convex and concave parts of the respective portions can provide a secure and locking feel. In embodiments where the device-side portion and the base portion are held together by magnetic attraction, mating concave and convex portions can prevent the device-side portion from sliding off of the interface portion of the base portion.

Figure 4:
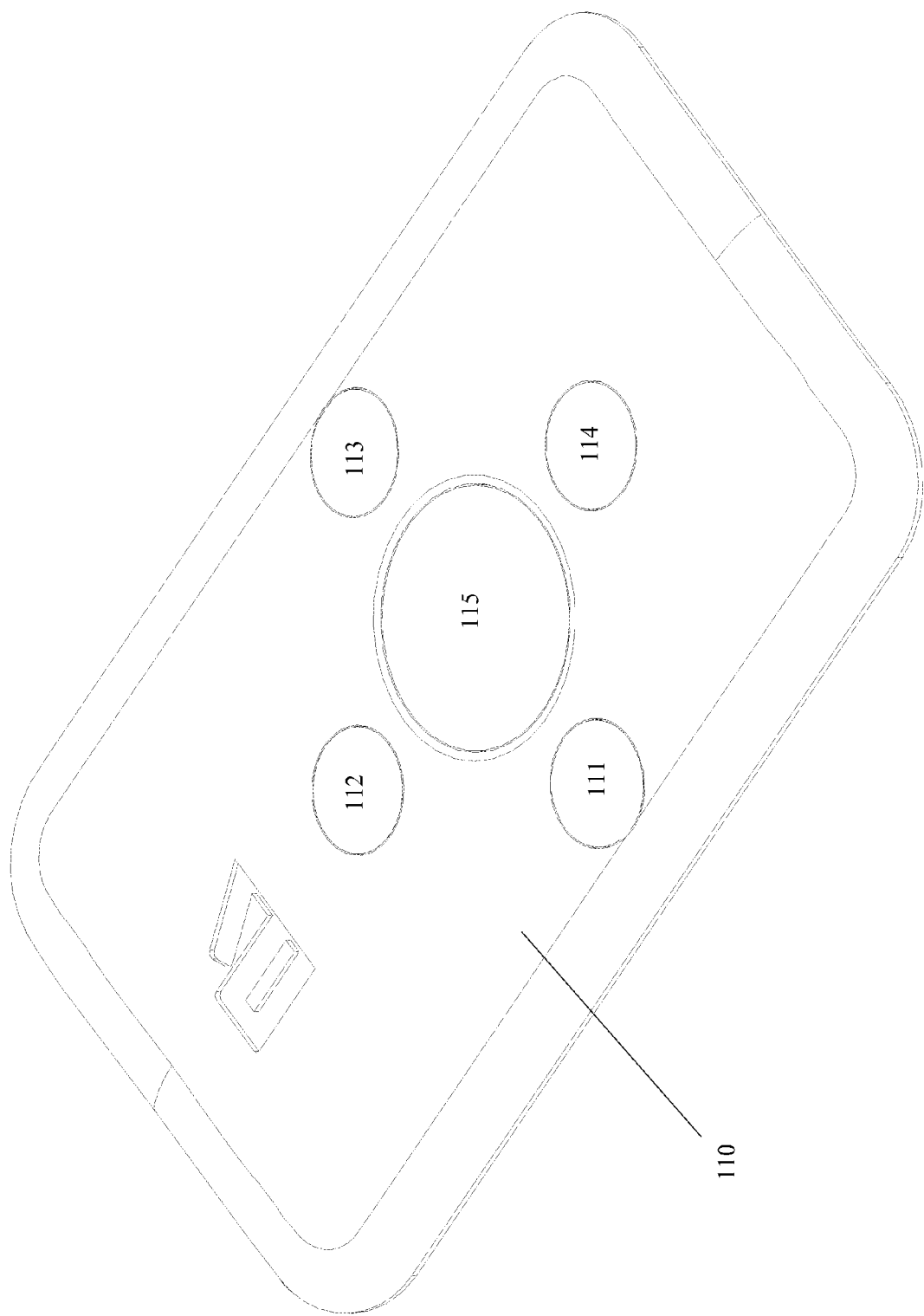
FIG. 4 is an isometric view of an outside surface of a device-side portion of a mounting system for an electronic device according to an exemplary embodiment of the invention.

FIG. 4 is an isometric view of an outside surface of a device-side portion of a mounting system for an electronic device. As shown in FIG. 4, the device-side portion 110 includes a central electrical contact 115 and radial electrical contacts 111-114. The electrical contacts 111-115 can be concave or convex with respect to the outside surface (not labeled) of the device side portion. The electrical contacts 111-114 can be electrically connected to the same electrical signal, such as a negative-leg of a DC power signal. The central electrical contact 115 can be connected to a positiveleg of a DC power signal. Any or all off the electrical contacts 111-115 can be formed from a ferromagnetic material. In preferred embodiments of the invention, magnets (not shown) are positioned behind the electrical contacts 111-115.

The radial electrical contacts 111-114 can be spaced apart from the central electrical contact 115 by a sufficient distance to prevent the device side portion from tipping and thereby becoming disconnected from the interface portion of the base portion (not shown). In preferred embodiments, the center of the central electrical contact 115 separated from the center of each of the radial electrical contacts 111-114 by ¾" of an inch or greater. The spacing is most advantageously ¾" or 1" or greater although other spacings, including spacings of less than ¾" will also provide the benefits of this invention. The mating electrical contacts of the interface portion 120 can have a corresponding spacing.

The device-side portion 110 can be part of the chassis or main body of an electronic device. Alternatively, the device-side portion 110 can be part of a case for an electrical device. In embodiments of the invention where the device-side portion 110 is part of a case for an electrical device, the electrical contacts 111-115 can connect to a port of the electronic device such as a charging port of the electronic device. In embodiments where the device-side portion 110 is part of the chassis of the main body of an electronic device, the electrical contacts 111-115 can be directly connected to the circuitry of the electronic device such as a charging circuit for a battery of the electronic device.

Figure 5:
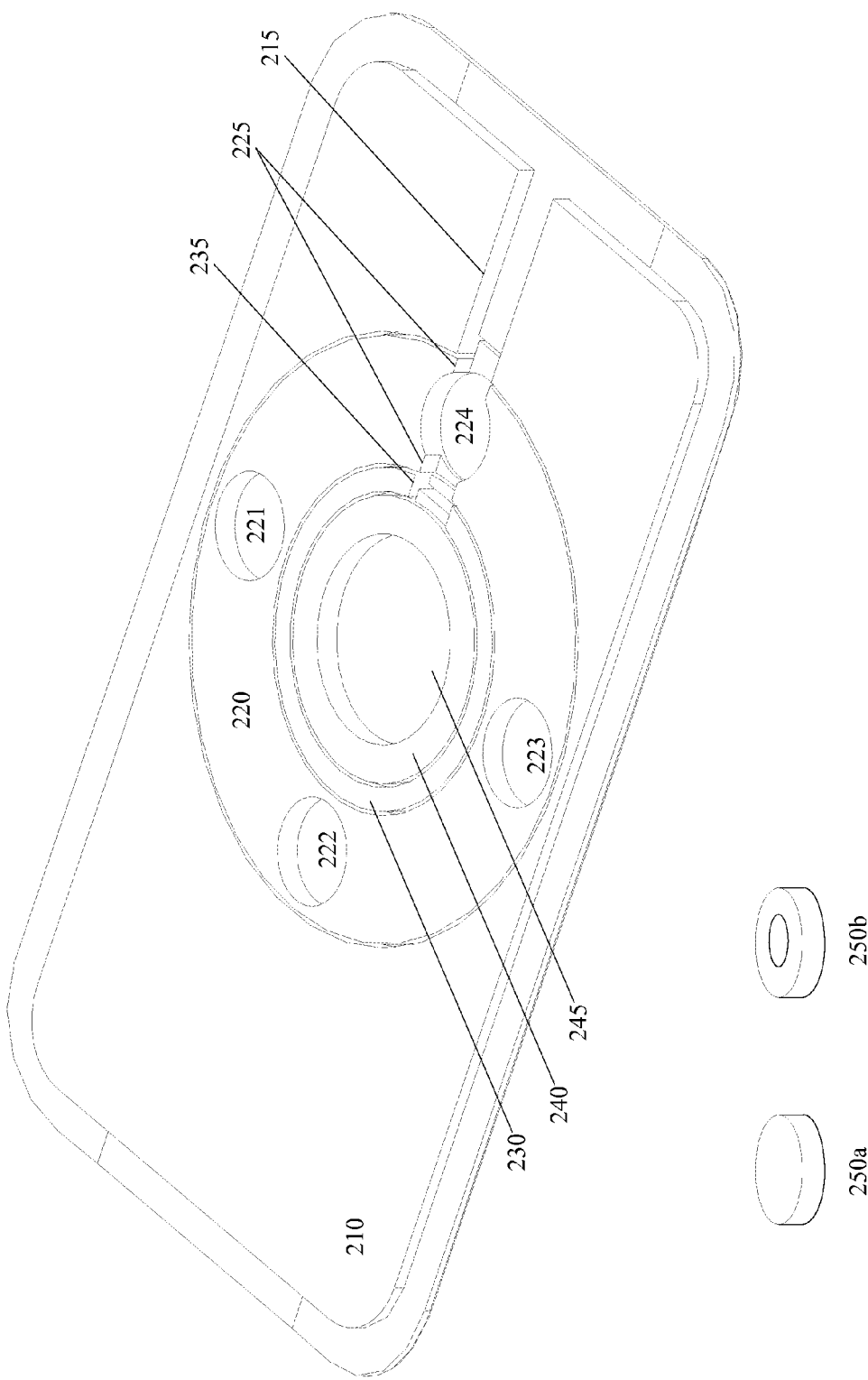
FIG. 5 is an isometric view of an inside surface of a device-side portion of a mounting system for an electronic device according to an exemplary embodiment of the invention.

FIG. 5 is an isometric view of an inside surface of a device-side portion of a mounting system for an electronic device. As shown in FIG. 5, the inside surface of a device side portion 210 can include an outer ring 220, an insulating ring 230, and an inner ring 240. The outer ring 220 can be formed from an electrically conductive material. The outer ring can be a magnet. The outer ring 220 can be formed from zinc, copper, a ferromagnetic material, or an alloy thereof. The outer ring 220 can include cutouts 221-224. The cutouts 221-224 can be disposed behind the electrical contacts 111-114 (not shown). The cutouts 221-224 can be radially offset from the electrical contacts 111-114 (not shown). In preferred embodiments the radial offset can be 45 degrees. Each of the electrical contacts 111-114 (not shown) can be electrically connected to the outer ring 220 or can be formed as part of the outer ring 220. When the electrical contacts 111-114 (not shown) are electrically connected to or formed as part of the outer ring 220, each of the electrical contacts 111-114 (not shown) are thereby form a single electrical conductor suitable for transmitting a single electrical signal such as the negative-leg or ground-leg of a DC power source. In other embodiments, the outer ring 220 is segmented with insulating material disposed between the segments such that each of the electrical contacts 111-114 (not shown) are electrically isolated.

The inner ring 240 can be separated from the outer ring 220 by the insulting ring 230. The inner ring 240 can include a cutout 245. The cutouts 221-224 and 245 can retain a magnet such as exemplary magnets 250a or 250b. The magnet 250a can be a solid, disk-style magnet. The magnet can be a donut-style magnet 250b. The disk-magnets 250a can be advantageous in embodiments where the cutouts 221-224 are offset from the electrical contacts 111-114 (not shown). The donut-magnets 250b can be advantageous where the cutouts 221-224 and 245 are positioned behind the electrical contacts 111-115 (not shown) and a wire or other conductor needs to pass through the center of the magnet to connect to the electrical contact.

The insulating ring 230 can include a channel 235, the outer ring 220 can include a channel 225, and the device side portion 210 can include a channel 215. The channels 235, 225, and 215, each respectively facilitate the passage of a wire or other electrical conductor (not shown) from the central ring 220 to an edge of the device-side portion 220. The channel 215 can extend to an edge of the device side portion 210 so that the wire or electrical conductor (not shown) can connect to a port on the electronic device. The port on the electronic device can be a power port.

The outer ring 220 can be electrically connected to the radial electrical contacts 111-114 (not shown). The inner ring 240 can be electrically connected to the central electrical contact 115 (not shown). The insulating ring 230 can be formed from plastic or other insulating material. In preferred embodiments of the invention, the insulating ring is formed from the same material as the device-side portion 210.

Figure 6:
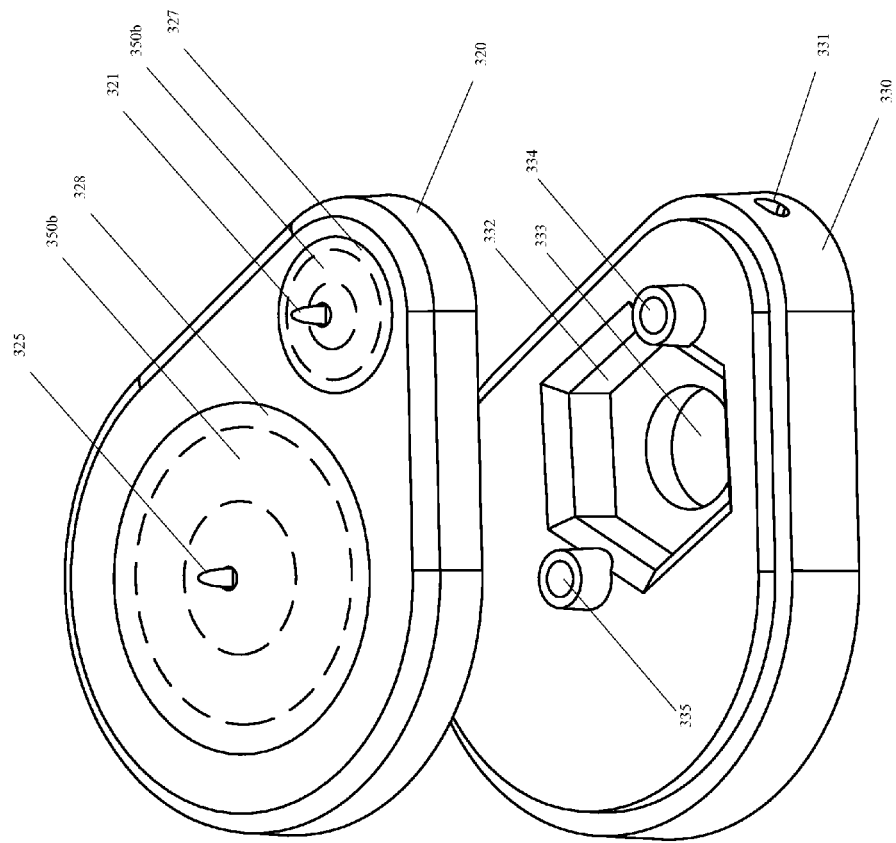
FIG. 6 is an isometric view of an interface portion of the mounting system for an electronic device according to an exemplary embodiment of the invention.

FIG. 6 is an isometric view of a base portion of the mounting system for an electronic device according to an exemplary embodiment of the invention. As shown in FIG. 6, the base portion includes an interface portion 320 and a housing 330. The interface portion 320 includes a central electrical contact 325 and a radial electrical contact 321. The interface portion 320 can include surrounding portions 327 and 328. The surrounding portions 327 and 328 can be concave or convex. The interface portion can include donut-style magnets 350b. Those of skill in the art will appreciate that the magnets 350b can alternatively be disposed in the housing 330. The housing 330 can include electrical through-holes 335 and 334. The through-holes 335 and 334 can be disposed below the electrical contacts 325 and 321 respectively. The through-holes 335 and 334 can allow the passage of a wire or other electrical conductor (not shown) to connect to the electrical contacts 325 and 321 and pass through the housing 330 to the exterior of the housing via element 331. Element 331 can be a hole that allows the passage of a wire. In preferred embodiments, element 331 is an electrical connector such as a USB port or a port for a barrel-style electrical connector.

The housing 330 can also include a cutout 332 for retaining a threaded nut (not shown). The housing 330 can include a through hole 333 that allows a bolt (not shown) to interface with the nut (not shown) in the cutout out 332. Used together, the nut (not shown) can be used to fix the housing 330 to another object with the bolt (not shown).

Referring to FIG. 4 and FIG. 6, the base portion of FIG. 6 can be sized to interface with the device-side portion 110 illustrated in FIG. 4. In embodiments where the base portion of FIG. 6 interfaces with the device-side portion of FIG. 4, the central electrical contact 325 can correspond to the central electrical contact 115. The radial electrical contact 321 can correspond to any of radial electrical contacts 111-114. The device-side portion 110 can interface with the base portion of FIG. 6 in any of four ordinal rotations—0 degrees, 90 degrees, 180 degrees, or 270 degrees. The user-selectable rotational position can be advantageous for selecting a portrait or landscape orientation for the electronic device.

Figure 7:
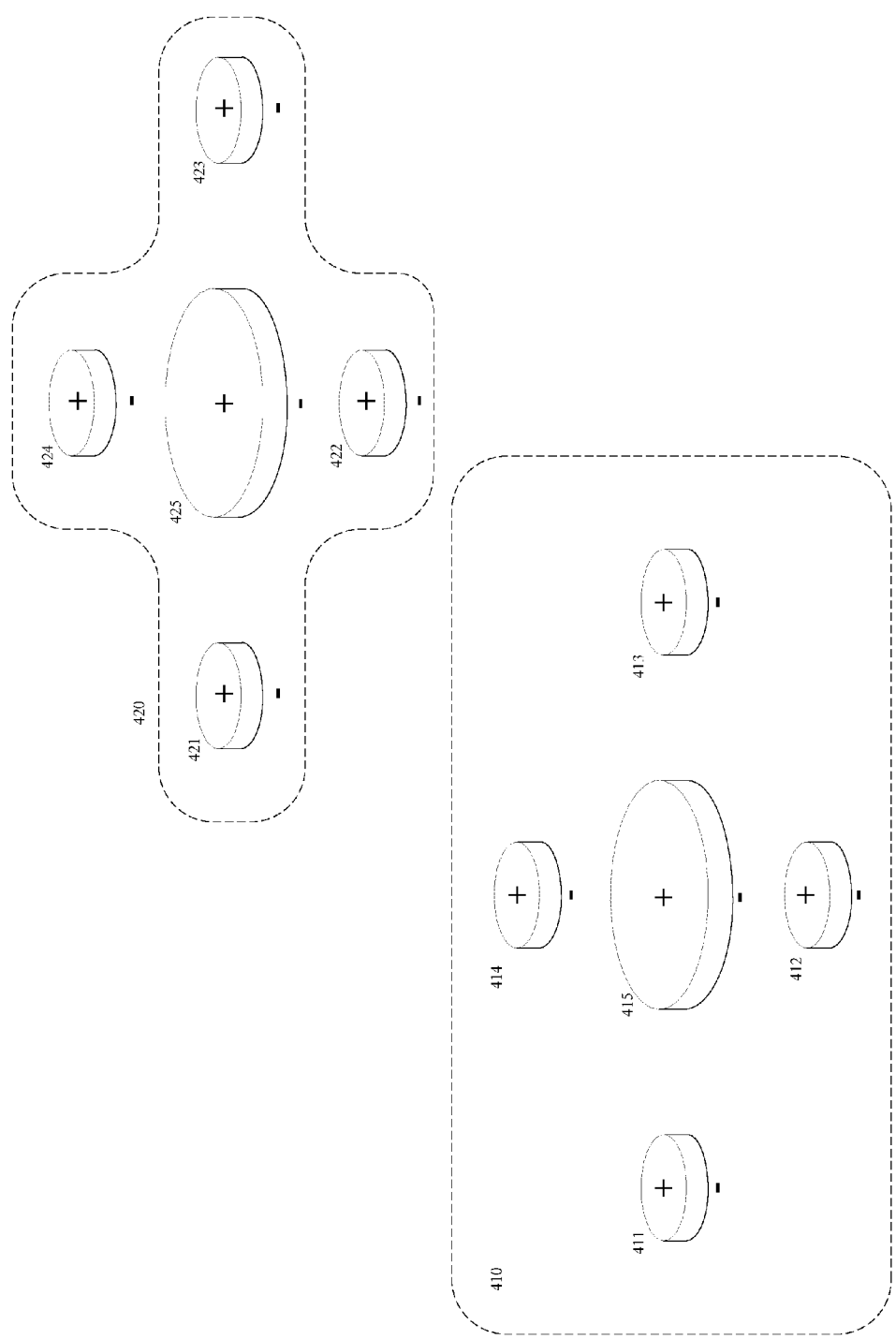
FIG. 7 is a first exemplary embodiment of a magnet polarity configuration.

FIG. 7 is drawing of a magnet polarity configuration for the mounting system according to an exemplary embodiment of the invention. As shown in FIG. 7, the magnets 411-415 on the device-side portion 410 can be oriented such that the polarity of each magnet is the same. In other words, each magnet 411-415 has a common pole facing up or towards the interface function. The magnets 421-425 in the base portion 420 can be oriented to have an opposite polarity. In other words, each magnet 421-425 has a common pole facing down or towards the interface junction. In the embodiment shown in FIG. 7, the base portion 420 is meant to drop on top of the device-side portion 410. The positive pole of each magnet 411-415 is facing up and the negative pole of each magnet 421-425 is facing down. In this way, the magnetic attraction between opposite poles holds the device-side portion 410 in connection the base portion 420.

Figure 8:
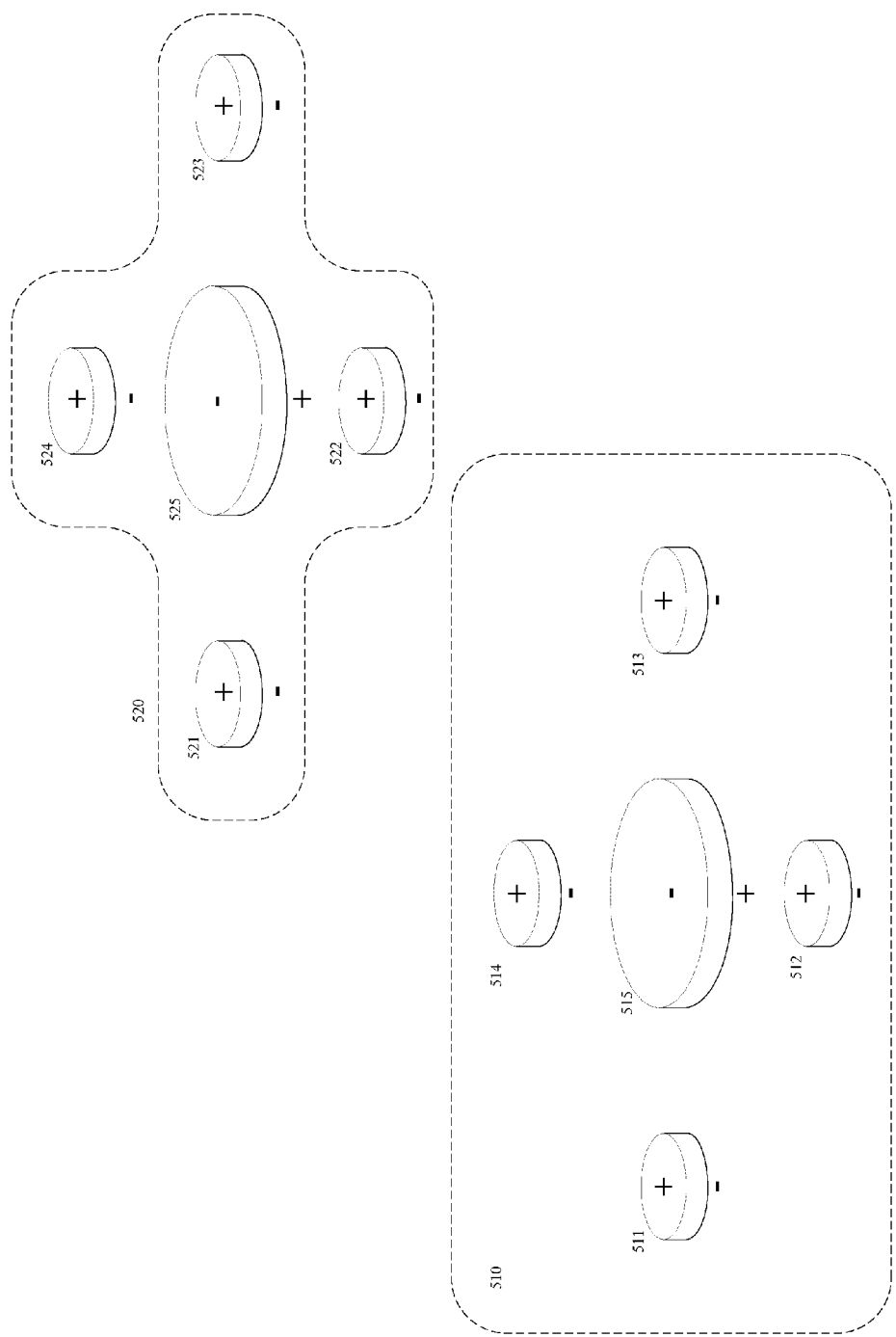
FIG. 8 is a second exemplary embodiment of a magnet polarity configuration.

FIG. 8 is drawing of a magnet polarity configuration for the mounting system according to an exemplary embodiment of the invention. As shown in FIG. 8, the device-side portion 510 includes magnets 511-515. The magnets 511-514 have a common orientation wherein each magnet has a positive pole facing up. The center magnet 515 has an opposite orientation wherein the positive pole is facing down. The magnets 521-525 in the base portion 520 are configured to have opposite polarity of the device-side portion. The magnets 521-524 have a negative pole facing downwards so as to cause a magnetic attraction to the positive poles of the magnets 511-514 of the device-side portion 510. The central magnet 525 has a positive pole facing downwards so as to cause a magnetic attraction to the negative pole of the central magnet 515 of the device-side portion 510.

The configuration of FIG. 8 is advantageous for aligning the device-side portion 510 and the base portion 520 as the polarity of the central magnets 515 and 525 tend to repel the radial magnets on the opposing side. This prevents misalignment of the device-side portion 510 and the base portion 520 and further facilities quick mounting with minimal precision or effort by the user.

While embodiments of the invention have been shown and described as having a single block comprising a plurality of plugs, it is contemplated that the invention may also be embodied as two or more blocks comprising one or more plugs. These blocks can be mounted on a chassis including a lever system or electromechanical actuators which can engage and disengage the blocks. Accordingly, this invention is not limited to the illustrated embodiments but also covers embodiments having multiple blocks of one or more plugs. Such a configuration can be useful for interfacing with an electronic device which has connectors on one or more sides.

It will be apparent to those skilled in the art that various modifications and variations can be made in the mounting system for an electronic device without departing from the spirit or scope of the invention. Thus, it is intended that embodiments of the invention cover the modifications and variations of this invention provided they come within the scope of the appended claims and their equivalents.

What is claimed is:

1. An apparatus for holding an electronic device, the apparatus comprising:
an interface surface;
a central electrical contact on the interface surface;
a first radial electrical contact on the interface surface;
a first magnetic member below the first radial electrical contact;
a second magnetic member below the central electrical contact;
a first hole of the first magnetic member;
a second hole of the second magnetic member;
a first magnetic pole of the first magnetic member on the interface surface;
an opposite magnetic pole of the second magnetic member on the interface surface;
wherein a portion of the first radial electrical contact passes through the first hole; and
wherein a portion of the central electrical contact passes through the second hole.

2. The apparatus of claim 1 further comprising:
a second radial electrical contact on the interface surface;
a third radial electrical contact on the interface surface; and
a fourth radial electrical contact on the interface surface.

3. The apparatus of claim 2 wherein the first, second, third, and fourth radial electrical contacts are radially offset by 90 degrees.

4. The apparatus of claim 2 wherein the first, second, third, and fourth radial electrical contacts are electrically connected.

5. The apparatus of claim 2 further comprising:
a third magnetic member near the second radial electrical contact;
a fourth magnetic member near the third radial electrical contact; and
a fifth magnetic member near the fourth radial electrical contact.

6. The apparatus of claim 2 further comprising:
a third magnetic member radially offset 45 degrees from the second radial electrical contact;
a fourth magnetic member radially offset 45 degrees from the third radial electrical contact; and
a fifth magnetic member radially offset 45 degrees from the fourth radial electrical contact.

7. The apparatus of claim 1 wherein a middle of the central electrical contact is spaced apart from a middle of the first radial electrical contact by at least ¾ inches.

8. The apparatus of claim 1 wherein a middle of the central electrical contact is spaced apart from a middle of the first radial electrical contact by at least 1 inch.

9. The apparatus of claim 1 further comprising:
a first convex portion surrounding the first radial electrical contact; and
a second convex portion surrounding the central electrical contact.

10. The apparatus of claim 1 wherein the first magnetic member radially offset from the first radial electrical contact.

11. The apparatus of claim 1 wherein the first magnetic member has a first cut-out and a portion of the first radial electrical contact passes through the first cut-out.

12. The apparatus of claim 1 wherein the second magnetic member has a second cut-out and a portion of the central electrical contact passes through the second cut-out.

13. An apparatus for holding an electronic device, the apparatus comprising:
an interface surface;
a central electrical contact on the interface surface;
a first radial electrical contact on the interface surface;
a first magnetic member below the first radial electrical contact;
a second magnetic member below the central electrical contact;
a second radial electrical contact on the interface surface and radially offset 90 degrees from the first radial electrical contact;
a third radial electrical contact on the interface surface and radially offset 90 degrees from the second radial electrical contact; and
a fourth radial electrical contact on the interface surface and radially offset 90 degrees from the third radial electrical contact;
a first hole of the first magnetic member;

a second hole of the second magnetic member;
a first magnetic pole of the first magnetic member on the interface surface;
an opposite magnetic pole of the second magnetic member on the interface surface;
wherein a portion of the first radial electrical contact passes through the first hole; and
wherein a portion of the central electrical contact passes through the second hole.

14. The apparatus of claim 13 wherein a middle of the central electrical contact is spaced apart from a middle of the first radial electrical contact by at least ¾ inches.

15. The apparatus of claim 13 wherein a middle of the central electrical contact is spaced apart from a middle of the first radial electrical contact by at least 1 inch.

16. The apparatus of claim 13 further comprising:
a first convex portion surrounding the first radial electrical contact; and
a second convex portion surrounding the central electrical contact.

17. An apparatus for holding an electronic device, the apparatus comprising:
an interface surface;
a central electrical contact on the interface surface;
a first radial electrical contact on the interface surface;
a first magnetic member below the first radial electrical contact;
a first magnetic pole of the first magnetic member, the first magnetic pole facing the interface surface;
a second magnetic member below the central electrical contact;
a second magnetic pole of the second magnetic member, the second magnetic pole facing the interface surface and being an opposite magnetic pole with respect to the first magnetic pole;
a first hole of the first magnetic member;
a second hole of the second magnetic member;
wherein a portion of the first radial electrical contact passes through the first hole;
wherein a portion of the central electrical contact passes through the second hole; and
wherein magnetic attraction created by the first magnetic member substantially maintains the electronic device in position to interface with the apparatus.

18. The apparatus of claim 17 wherein a middle of the central electrical contact is spaced apart from a middle of the first radial electrical contact by at least ¾ inches.

19. The apparatus of claim 17 wherein a middle of the central electrical contact is spaced apart from a middle of the first radial electrical contact by at least 1 inch.

20. The apparatus of claim 17 further comprising:
a first convex portion surrounding the first radial electrical contact; and
a second convex portion surrounding the central electrical contact.

* * * * *